(12) United States Patent
Roohparvar (10) Patent No.: US 6,275,961 B1
(45) Date of Patent: *Aug. 14, 2001

(54) CIRCUIT AND METHOD FOR PERFORMING TESTS ON MEMORY ARRAY CELLS USING EXTERNAL SENSE AMPLIFIER REFERENCE CURRENT (75) Inventor: Frankie Roohparvar, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/549,631

(22) Filed: Apr. 14, 2000

Related U.S. Application Data (63) Continuation of application No. 09/146,295, filed on Sep. 3, 1998, now Pat. No. 6,052,321, which is a continuation of application No. 08/843,520, filed on Apr. 16, 1997, now Pat. No. 5,956,277, which is a continuation of application No. 08/607,708, filed on Feb. 27, 1996, now Pat. No. 5,661,690.

(51) Int. Cl.[7] ................................................. G11C 29/00
(52) U.S. Cl. .................... 714/718; 714/724; 365/185.2; 365/189.07; 365/189.09; 365/201
(58) Field of Search ........................ 714/718, 724; 365/185.2, 185.25, 189.07, 189.09, 201, 210

(56) References Cited

U.S. PATENT DOCUMENTS

| | | | |
|---|---|---|---|
| 5,444,656 | * 8/1995 | Bauer et al. | 365/185.2 |
| 5,526,364 | * 6/1996 | Roohparvar | 714/724 |
| 5,539,694 | * 7/1996 | Rouy | 365/201 |
| 5,594,694 | * 1/1997 | Roohparvar et al. | 365/201 |
| 5,600,594 | * 2/1997 | Padoan et al. | 365/185.2 |
| 5,619,461 | * 4/1997 | Roohparvar | 365/201 |
| 5,627,784 | * 5/1997 | Roohparvar | 365/189.01 |
| 5,661,690 | 8/1997 | Roohparvar | 365/201 |
| 5,675,539 | * 10/1997 | Mirabel et al. | 365/185.25 |

* cited by examiner

Primary Examiner—Emmanuel L. Moise
(74) Attorney, Agent, or Firm—Schwegman, Lundberg, Woessner & Kluth, P.A.

(57) ABSTRACT

An integrated memory circuit (chip) and methods for testing the chip. The chip has an array of memory cells, a sense amplifier for reading selected ones of the cells, and a switch having a first state allowing an external device connected to an external pad to sink a reference current from the sense amplifier and a second state disconnecting the pad from the sense amplifier (so that an internally generated reference current can be supplied to the sense amplifier with the switch in the second state). In the first state, the switch preferably is tolerant of a broad and continuous range of voltages on the pad. In some test modes, cells are read using a sense amplifier of the chip while selected voltages are applied to each cell and external equipment sinks reference current flowing from the sense amplifier through an external pad, thus sensing data from each cell with all the timing constraints usually placed on a read of the cell in the normal mode. In one test mode, all wordlines of the array are disabled and a read cycle is performed to measure all columns of the array sequentially while an external reference current flows between external test equipment and a sense amplifier used for performing the read cycle, and the sense amplifier output indicates whether one or more of the columns has leaky cells.

32 Claims, 4 Drawing Sheets

CIRCUIT AND METHOD FOR PERFORMING TESTS ON MEMORY ARRAY CELLS USING EXTERNAL SENSE AMPLIFIER REFERENCE CURRENT

This application is a continuation of U.S. Ser. No. 09/146,295 which is a continuation of U.S. Ser. No. 08/843, 520 filed Apr. 16, 199, now U.S. Pat. No. 5,956,277 which is a continuation of U.S. Ser. No. 08/607,708 filed Feb. 27, 1996, now U.S. Pat. No. 5,661,690.

BACKGROUND OF THE INVENTION

1. Field of the Invention

The invention pertains to an integrated memory circuit having memory array cells (e.g., nonvolatile memory cells), which normally reads the cells in a mode in which an internally-generated reference current is provided to (or sunk from) one or more sense amplifiers, but which alternatively operates in a test mode in which an external device sources or sinks a selected external reference current which flows through an external pad to or from the sense amplifiers. The integrated circuit of the invention includes circuitry which operates in a test mode to allow any of a wide range of sense amplifier reference currents to flow through an external pad between at least one sense amplifier and an external device connected to the pad.

2. Description of Related Art

Throughout the specification, including in the claims, the terms "connects" and "connected" are used (in the context that an electronic component is "connected" to another electronic component or "connects" one circuit element to another) in a broad sense to denote that the components are electrically or electromagnetically coupled with sufficient strength under the circumstances. It is not used in a narrow sense requiring that an electrically conducting element is physically connected between the two components.

Nonvolatile memory chips (integrated circuits) with higher density are being introduced to the market each day. In order to achieve higher density, chip manufacturers must continually decrease the size of elements of the chips (such as the size of each cell of a memory array implemented in each chip). With memory array cells having submicron feature sizes, the slightest change in processing of one memory cell relative to another during manufacture results in a big difference in the behavior of the cells with respect to each other.

Many conventional memory chips operate in either a test mode in which input/output ("I/O") pads are connected directly to an array of memory cells, or in a "normal" (or "active") mode in which the I/O pads are connected through buffer circuitry to the array of memory cells. In the latter mode (the "normal" mode) the chip can perform read/write operations in which data is written to selected ones of the cells through an input buffer (or data is read from selected ones of the cells through an output buffer).

Figure 1:
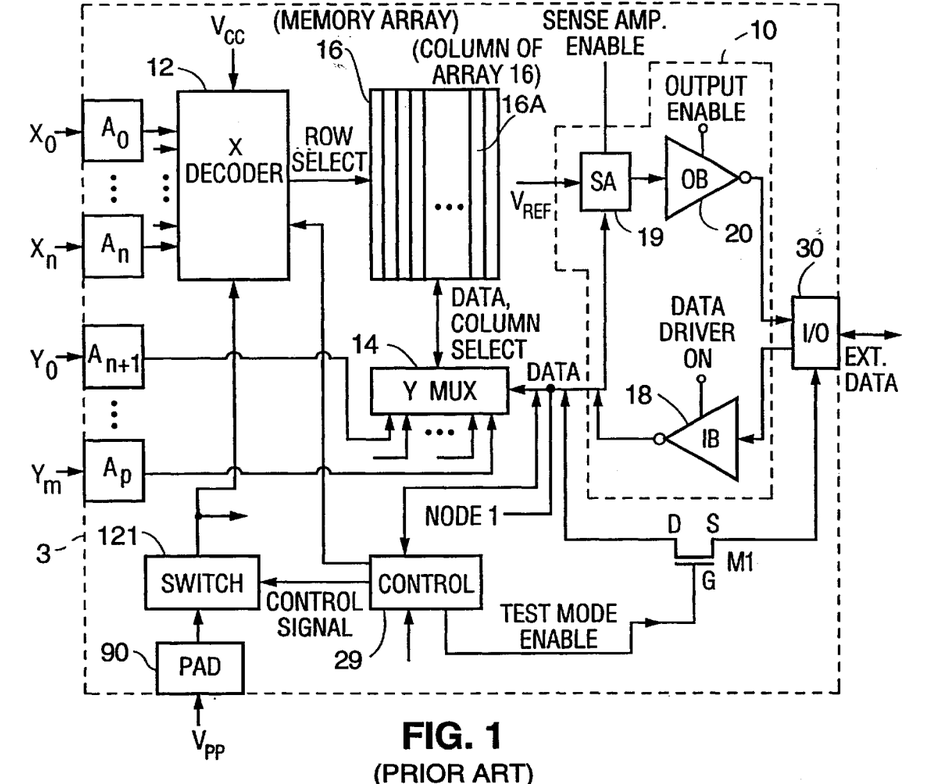
FIG. 1 is block diagram of a conventional nonvolatile memory circuit (implemented as an integrated circuit).

FIG. 1 is a simplified block diagram of a conventional memory chip of this type. Memory chip 3 of FIG. 1 includes at least one I/O pad 30 (for asserting output data to an external device or receiving input data from an external device), input/output buffer circuit 10 for I/O pad 30, test mode switch M1, address buffers A0 through Ap for receiving memory address bits from an external device, row decoder circuit (X address decoder) 12, column multiplexer circuit (Y multiplexer) 14, memory array 16 (comprising columns of nonvolatile memory cells, such as column 16A), pad 90, switch 121 connected between pad 90 and other components of chip 3, and control unit 29. Each of the cells is preferably a flash memory device, for example of the type described with reference to FIG. 2. Each of address buffers A0 through Ap includes an address bit pad for receiving (from an external device) a different one of address bit signals X0 through Xn and Y0 through Ym.

I/O buffer circuit 10 includes a "write" branch and a "read" branch. The write branch comprises input buffer 18. The read branch comprises sense amplifier 19 and output buffer 20.

In the normal operating mode of chip 3 of FIG. 1, control unit 29 can cause chip 3 to execute a write operation in which it receives data (to be written to memory array 16) from an external device at I/O pad 30, buffers the data in the write branch, and then writes the data to the appropriate memory cell. In this normal operating mode, control unit 29 can also cause chip 3 to execute a read operation in which it amplifies and buffers data (that has been read from array 16) in the read branch, and then asserts this data to I/O pad 30.

Although only one I/O pad (pad 30) is shown in FIG. 1, typical implementations of the FIG. 1 circuit include a plurality of I/O pads, and each I/O pad is buffered by an I/O buffer circuit similar or identical to circuit 10. For example, one implementation of the FIG. 1 circuit includes eight I/O pads, eight buffer circuits identical to circuit 10, one line connected between the output of the output buffer 20 of each buffer circuit and one of the I/O pads (so that eight data bits can be read in parallel from buffers 20 to the pads), and one line connected between the input of the input buffer 18 of each buffer circuit and one of the I/O pads (so that eight data bits can be written in parallel from the pads to buffers 18). Each I/O pad (including I/O pad 30) typically has high impedance when the output buffer is not enabled.

Figure 2:
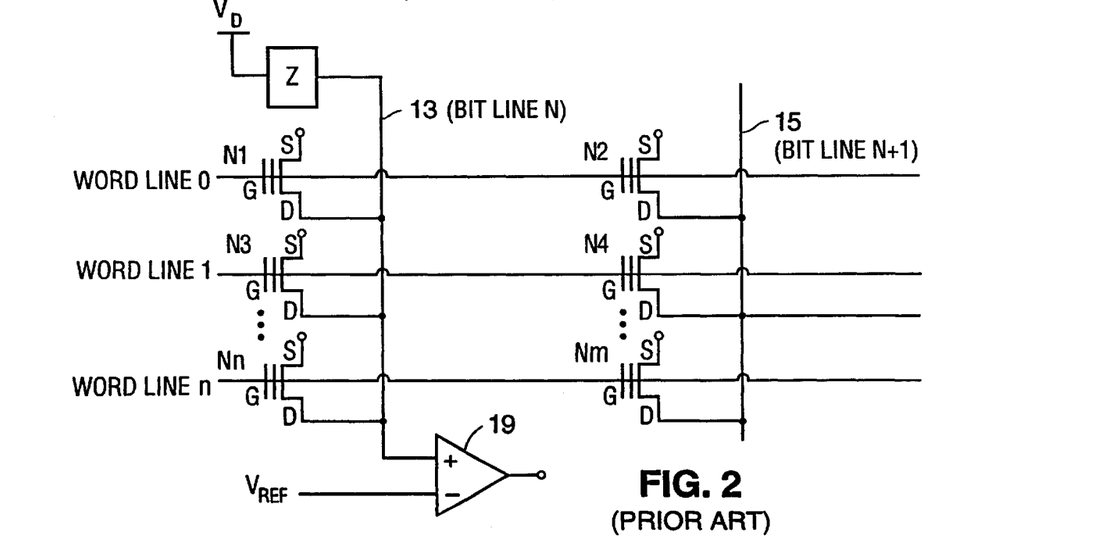
FIG. 2 is a simplified schematic diagram of two columns of memory cells of memory array 16 of FIG. 1.

Each of the cells (storage locations) of memory array circuit 16 is indexed by a row index (an "X" index determined by decoder circuit 12) and a column index (a "Y" index output determined by circuit 14). FIG. 2 is a simplified schematic diagram of two columns of cells of memory array 16 (with one column, e.g., the column on the right, corresponding to column 16A of FIG. 1). The column on the left side of FIG. 2 comprises "n" memory cells, each cell implemented by one of floating-gate N-channel transistors N1, N3, . . . , Nn. The drain of each of transistors N1-Nn is connected to bitline 13, and the gate of each is connected to a different wordline (a different one of wordline 0 through wordline n). The column on the right side of FIG. 2 also comprises "n" memory cells, each cell implemented by one of floating-gate N-channel transistors N2, N4, . . . , Nm. The drain of each of transistors N2-Nm is connected to bitline 15, and the gate of each is connected to a different wordline (a different one of wordline 0 through wordline n). The source of each of transistors N1, N3, . . . , Nn, and N2, N4, . . . , Nm is held at a source potential (which is usually ground potential for the chip during a read or programming operation).

Each memory cell is a nonvolatile memory cell since each of transistors N1, N3, . . . , Nn, and N2, N4, . . . , Nm has a floating gate capable of semipermanent charge storage. The current drawn by each cell (i.e., by each of transistors N1, N3, . . . , Nn, and N2, N4, . . . , Nm) depends on the amount of charge stored on the cell's floating gate. Thus, the charge stored on each floating gate determines a data value that is stored "semipermanently" in the corresponding cell. In cases in which each of transistors N1, N3, . . . , Nn, N2, N4, . . . , and Nm is a flash memory device (as indicated in FIG. 2 by the symbol employed to denote each of transistors N1, N3, . . . , Nn, N2, N4, . . . , and Nm), the charge stored on the floating gate of each is erasable (and thus the data value stored by each cell is erasable) by appropriately changing the voltage applied to the gate and source (in a well known manner).

The manner in which sense amplifier 19 (shown in FIG. 1 and shown directly connected to bitline 13 in FIG. 2) is employed to read each cell connected along bitline 13 will next be described.

In response to address bits Y0–Ym, Y multiplexer circuit 14 (of FIG. 1) determines a column address which selects one of the columns of cells of array 16 (connecting the bitline of the selected column to Node 1 of FIG. 1), and in response to address bits X0–Xn, decoder circuit 12 (of FIG. 1) determines a row address which selects one cell in the selected column. Consider an example in which the column address selects the column on the left side of FIG. 2 (the column including bitline 13) and the row address selects the cell connected along wordline 0 (the cell comprising transistor N1). To read the data value stored in the selected cell, a signal (a current signal) indicative of such value is provided from the cell's drain (the drain of transistor N1, in the example), through bitline 13 and circuit 14, to Node 1 of FIG. 1 (which is the noninverting input of sense amplifier 19 as shown in FIG. 2). To write a data value to the selected cell, a signal indicative of such value is provided to the cell's gate and drain (the gate and drain of transistor N1, in the example). The reference input terminal of sense amplifier 19 (which is the inverting input terminal in FIG. 1) is held at reference voltage $V_{REF}$ by circuitry (not shown in FIG. 1) which is part of chip 3. An example of such internal reference voltage supply circuitry is that of FIG. 5 of U.S. Pat. application Ser. No. 08/508,923 entitled "Memory System Having Non-volatile Data Storage Structure for Memory Control Parameters and Method," filed by F. Roohparvar on Jul. 28, 1995, now U.S. Pat. No. 5,627,784 (assigned to the assignee of the present application).

When reading the selected cell, if the cell is in an erased state, the cell will conduct a first current which is converted to a first voltage in sense amplifier 19. If the cell is in a programmed state, it will conduct a second current which is converted to a second voltage in sense amplifier 19. Sense amplifier 19 determines the state of the cell (i.e., whether it is programmed or erased corresponding to a binary value of 0 or 1, respectively) by comparing the voltage indicative of the cell state to reference voltage $V_{REF}$. The outcome of this comparison is an output which is either high or low (corresponding to a digital value of one or zero) which sense amplifier 19 sends to output buffer 20. Output buffer 20 in turn asserts a corresponding data signal to I/O pad 30 (from which it can be accessed by an external device).

Sense amplifier 19 can be employed in various memory operations, including verification operations (each of which is part of an erase or programming operation) for verifying the programmed or erased state of cells of a memory array, and read operations (which are not part of an erase or programming operation). In all of these operations, the sense amplifier develops a voltage which is indicative of current flow through a cell being sensed, and the sense amplifier compares this sensed voltage to reference voltage $V_{REF}$. Typically, the reference voltage $V_{REF}$ has one value in read operations and program verify operations and another value in erase verification operations.

For example, sense amplifier 19 of FIG. 2 (whose noninverting input terminal is connected to bitline 13) can be used to verify the state of flash memory cell N1 of FIG. 2 as part of an attempt to erase this cell. To do so, the other cells connected to bitline 13 are deselected and a voltage (e.g., +5.5 volts) is applied to cell N1's wordline. If the wordline voltage exceeds the erased threshold voltage, cell N1 conducts a cell current (which flows from a node held at drain voltage $V_D$ through load 13A connected along bitline 13, and from the drain to the source of cell N1). This cell current is indicative of the erased threshold voltage of the cell, with such current causing a drop in voltage at the noninverting input terminal of sense amplifier 19 (below the voltage that would exist in the absence of cell current). If the voltage at the noninverting input terminal of sense amplifier 19 drops below the reference voltage $V_{REF}$ provided at the reference input terminal (inverting input terminal) of sense amplifier 19, the output of sense amplifier 19 goes low (which is normally interpreted to indicate that the cell has been adequately erased). Otherwise, the output of sense amplifier 19 is high, which is normally interpreted to indicate that the cell has not been adequately erased.

With reference again to FIG. 1, the function of switch M1 is to switch the FIG. 1 chip between its test mode and its normal operating mode. Conventionally, switch M1 is an NMOS transistor whose gate receives a control signal ("Test Mode Enable") from internal control logic within control unit 29. The source and drain of M1 are connected in series with I/O pad 30 and circuit 14. Switch M1 operates as follows in response to the control signal:

M1 is "on" when Test Mode Enable is high (when the value of Test Mode Enable triggers the "test" mode of FIG. 1), and thus M1 functions as a pass transistor which passes a signal (a "test" signal) indicative of test data to be written to or read from a selected cell of array 16 (e.g., a current signal indicative of test data read from the selected cell) between its source and drain (and thus between I/O pad 30 and the selected cell of array 16). If buffers 18 and 20 of circuit 10 are disabled when M1 is on, the test signals pass through M1 but not through circuit 10; and M1 is "off" when Test Mode Enable is low (when the value of Test Mode Enable triggers the "normal" operating mode of FIG. 1), so that signals (indicative of data to be written to array 16) provided from an external device to I/O pad 30 are buffered in input buffer 18 and then asserted to array 16, or signals (indicative of data read from array 16) are asserted from array 16 to sense amplifier 19, and the output of sense amplifier 19 is buffered in output buffer 20 and asserted to I/O pad 30. Typically, the "low" value of Test Mode Enable is ground potential.

In the normal operating mode of FIG. 1 (with M1 "off"), the FIG. 1 circuit executes a write operation as follows. Each of address buffers AO through An asserts one of bits X0–Xn to decoder circuit 12, and each of address buffers An+1 through Ap asserts one of bits Y0–Ym to circuit 14. In response to these address bits, circuit 14 determines a column address (which selects one of the columns of memory cells of array 16, such as column 16A), and circuit 12 determines a row address (which selects one cell in the selected column). In response to a write command supplied from control unit 29, a signal (indicative of data) present at the output of input buffer 18 (which has been enabled by the appropriate level of the control signal "DATA DRIVER ON") is asserted through circuit 14 to the cell of array 16 determined by the row and column address (e.g., to the drain of such cell). During such write operation, output buffer 20 is disabled (in response to an appropriate level of control signal OUTPUT ENABLE).

A data latch (not shown in FIG. 1) is typically provided between input buffer 18 and I/O pad 30 for storing data (to be written to a memory cell) received from I/O pad 30. When the latched data is sent to input buffer 18, buffer 18 produces a voltage at Node 1 which is applied to the selected memory cell. Input buffer 18 is typically implemented as a tri-statable driver having an output which can be placed in a high impedance mode (and thus disabled) during a read operation. Input buffer 18 is disabled by asserting (to input buffer 18) an appropriate level of the control signal DATA DRIVER ON. In some implementations, the functions of the latch and input buffer 18 are combined into a single device.

In the normal operating mode (with M1 "off"), the FIG. 1 circuit executes a read operation as follows. Each of address buffers A0 through An asserts one of bits X0–Xn to address decoder circuit 12, and each of address buffers An+1 through Ap asserts one of bits Y0–Ym to circuit 14. In response to these address bits, circuit 14 asserts a column address to memory array 16 (which selects one of the columns of memory cells, such as column 16A), and circuit 12 asserts a row address to memory array 16 (which selects one cell in the selected column). In response to a read command supplied from control unit 29, a current signal indicative of a data value stored in the cell of array 16 (a "data signal") determined by the row and column address is supplied from the drain of the selected cell through the bitline of the selected cell and then through circuit 14 to sense amplifier 19. The output of sense amplifier 19 is buffered in output buffer 20 (which is enabled by an appropriate level of control signal "OUTPUT ENABLE") and finally asserted at I/O pad 30. During such read operation, input buffer 18 is disabled (in response to an appropriate level of control signal DATA DRIVER ON).

Chip 3 of FIG. 1 also includes a pad 90 which receives a high voltage $V_{pp}$ from an external device, and a switch 121 connected to pad 90. During some steps of a typical erase or program sequence (in which the cells of array 16 are erased or programmed), control unit 29 sends a control signal to switch 121 to cause switch 121 to close and thereby assert high voltage $V_{pp}$ to various components of the chip including X decoder 12. Voltage $V_{pp}$ is higher (typically $V_{pp}$=12 volts) than the normal operating mode supply voltage (typically $V_{cc}$=5 volts or $V_{cc}$=5.5 volts) for the MOS transistors of chip 3.

During the test mode, input buffer 18, sense amplifier 19, and output buffer 20 are all disabled (in response to appropriate levels of their respective control signals DATA DRIVER ON, SENSE AMPLIFIER ENABLE, and OUTPUT ENABLE, which are generated by control unit 29).

During a write operation in the normal operating mode, control signal SENSE AMPLIFIER ENABLE disables sense amplifier 19. During a read operation in the normal operating mode, circuit 14 is employed to access the desired cell in array 16 and control signal SENSE AMPLIFIER ENABLE enables sense amplifier 19 so that sense amplifier 19 can determine the state of the selected cell as described.

Figure 3:
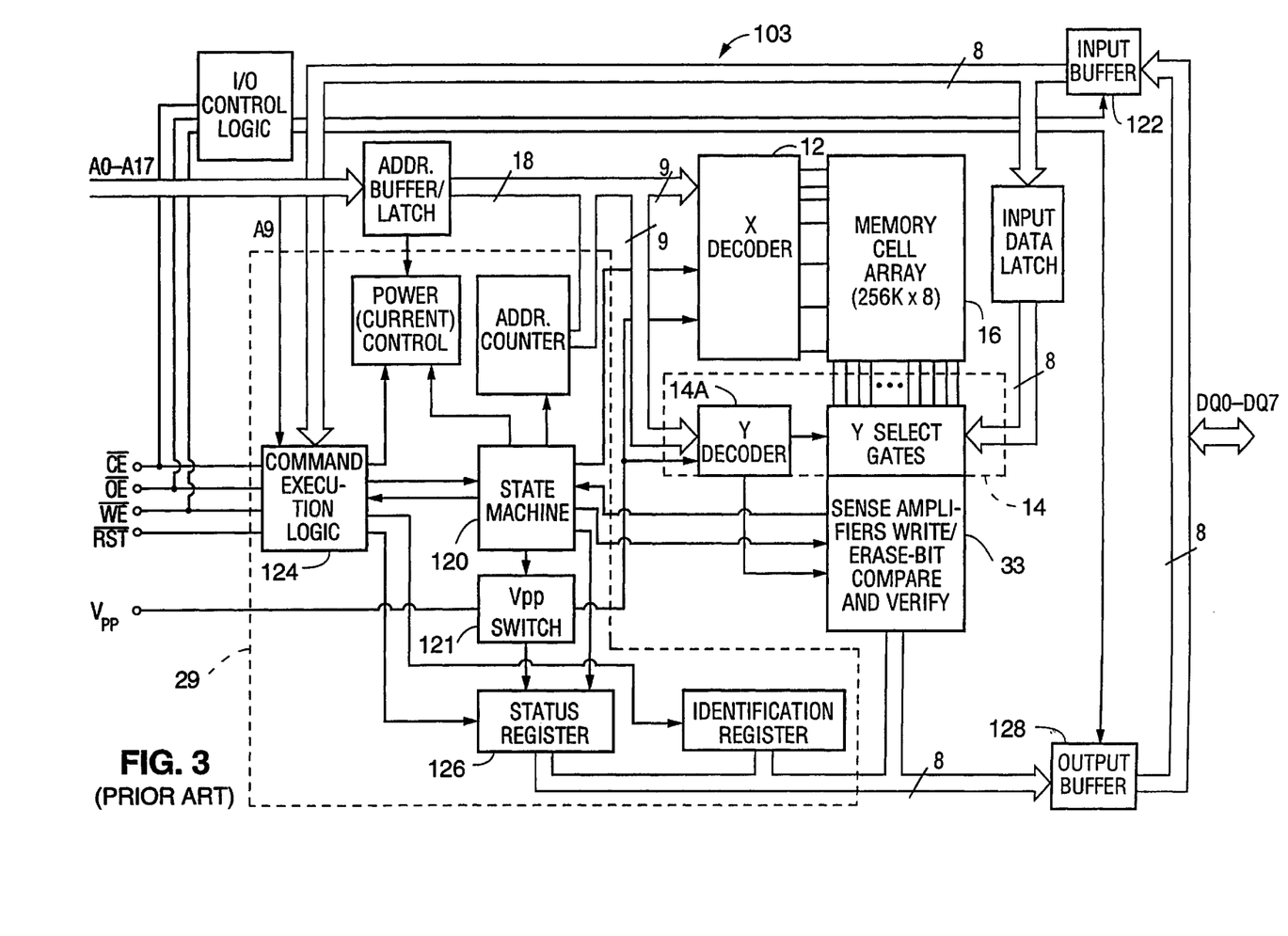
FIG. 3 is block diagram of a conventional nonvolatile (flash) memory integrated circuit.

FIG. 3 is a block diagram of a conventional flash memory chip 103 which is a variation on memory chip 3 of FIG. 1 and which performs essentially all the same functions as does chip 3. The components of flash memory system 103 which correspond to components of memory chip 3 of FIG. 1 are identified by the same reference numerals as in FIG. 1. Memory array 16 of system 103 consists of flash memory cells arranged in rows and columns with a total of 256K of eight bit words in the array. The individual cells (not depicted) are addressed by eighteen address bits (A0–A17), with nine bits being used by X decoder circuit 12 to select the row of array 16 in which the target cell is located and the remaining nine bits being used by Y decoder circuit 14A (of Y-multiplexer 14) to select the appropriate column of array 16. Each target cell is read using a sense amplifier and associated components represented by block 33. Block 33 can include one sense amplifier (which can be coupled to any column selected by Y-multiplexer 14, or several sense amplifiers (each of which can be coupled to a selected column of a different subset of the columns of array 16). Each sense amplifier can be identical to sense amplifier 19 of above-discussed FIG. 1 or below-discussed FIG. 4.

Internal state machine 120 of control unit 29 of chip 103 controls detailed operations of chip 103 such as the various individual steps necessary for carrying out programming, reading and erasing operations. State machine 120 thus functions to reduce the overhead required of the processor (not depicted) typically used in association with chip 103.

If memory array 16 is to be erased (typically, all or large blocks of cells are erased at the same time), the processor must cause the Output Enable $\overline{OE}$ pin to be inactive (high), and the Chip Enable $\overline{CE}$ and Write Enable $\overline{WE}$ pins to be active (low). The processor can then issue an 8 bit command 20H (0010 0000) on data I/O pins DQ0–DQ7, typically called an Erase Setup command (one of I/O pins DQ0–DQ7 corresponds to I/O pad 30 of FIG. 1). This is followed by issuance of a second eight bit command D0H (1101 0000), typically called an Erase Confirm command. Two separate commands are used so as to minimize the possibility of an inadvertent erase operation.

The commands are transferred to data input buffer 122 (input buffer 18 of FIG. 1 corresponds to a component of buffer 122 which receives one bit of each command) and the commands are then transferred to command execution logic unit 124 of control unit 29. Logic unit 124 then instructs state machine 120 to perform all of the numerous and well known steps for erasing array 16.

During some steps of a typical erase sequence, state machine 120 sends a control signal to switch 121, to cause switch 121 to close and thereby assert a high voltage $V_{pp}$ to various components of chip 103, including X decoder 12 and Y multiplexer 14. As in chip 3 of FIG. 1, voltage $V_{pp}$ is typically received by chip 103 from an external device at a power supply pad of chip 103 connected to switch 121 (e.g., pad 90 shown in FIG. 1). Voltage $V_{pp}$ is higher (typically $V_{pp}$=12 volts) than the normal operating mode supply voltage (typically $V_{cc}$=5 volts or $V_{cc}$=5.5 volts) for the MOS transistors of chip 103.

Once the erase sequence is completed, state machine 120 updates an 8 bit status register 126, the contents of which are transferred to data output buffer 128 which is connected to data I/O pins DQ0–DQ7 of the memory system (output buffer 18 of FIG. 1 corresponds to a component of buffer 128 which receives one bit from register 126). The processor periodically polls the data I/O pins to read the contents of status register 126 in order to determine whether the erase sequence has been completed and whether it has been completed successfully.

Chip 103 of FIG. 3 (and chip 3 of FIG. 1) typically implements a complicated sequence of steps to erase all or selected ones of the cells of array 16 (so that they store data indicative of a logical "1") or to program all or selected ones of such cells (so that they store data indicative of a logical "0"). These steps typically include verification steps for verifying the status of all or selected ones of the cells at various stages of an erase (or programming) operation.

During a typical erase operation, it is desired to erase all the cells of array 16 so that the threshold voltages are all within a specified voltage range. That range is typically a small positive voltage range such as from +1.5 to +3.0 volts. If the erased cells fall within this range, the cell to be read (the "selected" or "target") cell will produce a cell current in a read operation. The presence of cell current flow indicates that the cell is in an erased state (logic "1") rather than a programmed state (logic "0"). Cell current is produced in a selected erased cell if the voltage applied to the control gate of the cell, by way of the wordline connected to X decoder 12, exceeds the threshold voltage of the erased cell. In addition, cells which are not being read ("deselected" cells) are prevented from producing a cell current even if such cells have been erased to a low threshold voltage state. By way of example, for cells located in the same row as the selected cell, by definition, share the same wordline as the selected cell. However, the drains of the deselected cells will be floating thereby preventing a cell current from being generated. Deselected cells in the same column will not conduct cell current because the wordlines of such deselected cells are typically grounded. Thus, the gate-source voltage of these cells will be insufficient to turn on these deselected cells even if they are in an erased state.

After an erase operation, the vast majority of cells will have a proper erased threshold voltage. However, it is possible that a few (or even one) of the cells may have responded differently to the erase sequence and such cell(s) have become overerased. If a cell is overerased, the net charge on its floating gate is positive. The result will be that the threshold voltage will be negative to some extent. Thus, when such overerased cell is deselected (the wordline connected to the overerased deselected cell is grounded), the deselected cell will nevertheless conduct current. This current will interfere with the reading of the selected cell thereby preventing proper memory operation.

It is necessary to perform a complicated sequence of steps to erase or program the cells of a conventional nonvolatile memory chip because the individual cells of each array of such a chip typically behave differently, and thus the chip's state machine needs to ensure that all cells have at least a minimum margin at the end of each erase (or program) operation. This, however, does not mean that all the cells will be left with the same threshold voltage ($V_{th}$) at the end of an erase or program operation. For example, if during programming of all cells of an array, the state machine sets the minimum $V_{th}$ of all programmed cells to 5.5 volts, there may be many cells that have been programmed to a $V_{th}$ in the range from 7 to 7.5 volts at the end of the programming operation. So, there is a range of $V_{th}$s for the programmed cells. The same is true for an erase operation, and thus there is typically a range of $V_{th}$s for the erased cells. The $V_{th}$. range for erased cells may typically be from 1 volt to 3 volts after an erase operation, if the maximum $V_{th}$ of an erased bit is set to 3 volts by the state machine.

Measuring the $V_{th}$ distribution of the cells of an array (after erase and program operations) is of great importance to memory manufacturers and designers. The degree of tightness of such distribution is a good indicator of how well the memory elements have been processed (e.g., during manufacture of the chip) and how well the state machine is functioning.

The threshold voltages ("$V_{th}$s") of nonvolatile cells of a memory array have conventionally been measured indirectly (during a test mode) by measuring current/voltage ("I/V") characteristics of the cells for a sequence of different voltages between the source and drain of each cell and then deriving the $V_{th}$ values from the measured I/V characteristics. For example, in a conventional test mode implemented by the FIG. 1 chip, a selected cell of array 16 is connected directly to I/O pad 30 (or to several I/O pads including I/O pad 30), and a current/voltage characterization is performed on the selected cell as follows. The voltage at the cell's drain (the potential at which bitline 15 of FIG. 2 is held, for example) is controllable since the selected bitline is directly connected to an external device through I/O pad 30, and the external device varies the voltage at which the bitline (bitline 15, in the example) is held. By sweeping the voltage on I/O pad 30 during the test mode and monitoring the resulting cell current (the current flowing from the selected cell's drain through bitline 15, circuit 14, Node 1, and switch M1 to I/O pad 30, in the example), an I/V curve for the cell is obtained. This process is repeated for each of a sequence of gate voltages to obtain a family of I/V curves for the cell, and the family of I/V curves is analyzed to determine the cell's threshold voltage.

There are several serious problems with (and limitations of) conventional methods (such as the method described in the previous paragraph) and conventional apparatus for test mode measurement of I/V curves for selected cells. One such problem is that the tester must arbitrarily assign a current value which characterizes a cell as an "erased" or "programmed" cell when analyzing the measured I/V curves. However, this arbitrarily assigned value is not necessarily the reference current value employed in the sense amplifier to determine the state of each cell during normal (non-test mode) chip operation. Thus, even though a cell is arbitrarily identified by the tester as a "programmed" cell (as a result of test mode operation of the chip), the sense amplifier may be able to read the cell as an erased cell (during normal operation of the chip).

Another of such problems is that measurement of cell current (in a conventional test mode) must be done through the measurement unit of the tester. Thus, the operations of switching from cell address to cell address and making the measurement for each cell consumes a very long time per byte. For a four megabyte or larger cell array, the amount of time required for measuring all the cells is very long, and the tester does not usually have the capability to make decisions regarding passage or failure of bits based on continuous I/V measurement.

U.S. patent application Ser. No. 08/511,614, filed Aug. 4, 1995, now abandoned, (assigned to the assignee of the present application), discloses a method and apparatus intended to overcome problems of conventional measurement of the threshold voltage ($V_{th}$) of cells of a memory chip. U.S. Ser. No. 08/511,614, now abandoned, teaches applying a sequence of selected voltages directly to wordlines of a flash memory cell array (and thus to the gates of all or selected ones of the rows of cells); in response to application of each selected voltage, employing the chip's read circuitry (including the sense amplifier and other circuitry employed to execute a read operation in the chip's normal operating mode) to read the cells connected along each wordline; and identifying which of the cells are read by the read circuitry as being in their intended (erased or programmed) state and which of them are not read as being in their intended state. By implementing such direct (or "true") $V_{th}$ measurements, the threshold voltage of each cell is rapidly and directly measured.

U.S. Ser. No. 08/511,614, now abandoned, discloses a switch which enables application of a wide range of voltages from an external device to the wordlines of the chip's memory array for measuring a full range of typical $V_{th}$ values for erased and programmed cells of the array. Use of this switch eliminates the following problem with a memory chip having conventional test mode circuitry (such as that of FIG. 1). In such a conventional chip, wordlines are accessed through PMOS transistors formed in a well in a row address decoder circuit (e.g., X decoder 12 of FIG. 1). The supply voltage for such PMOS transistors (denoted as $V_{cc}$ in FIG. 1) is typically equal to 5 volts or 5.5 volts. If an attempt were made to decrease a "wordline voltage" (a voltage to be applied to a wordline through the decoder) from $V_{cc}$ to a selected value less than ($V_{cc}-V_t$), where $V_t$ is the threshold voltage (typically less than 1 volt) of the decoder's PMOS devices, the well would turn on and clamp the wordline voltage (thus preventing the wordline voltage from being further decreased to the selected value). This would prevent the wordline voltage from being decreased to values that are sufficiently low (e.g., values in the range from 1 volt to 3.5 volts) to measure the $V_{th}$s of typical erased cells.

Figure 4:
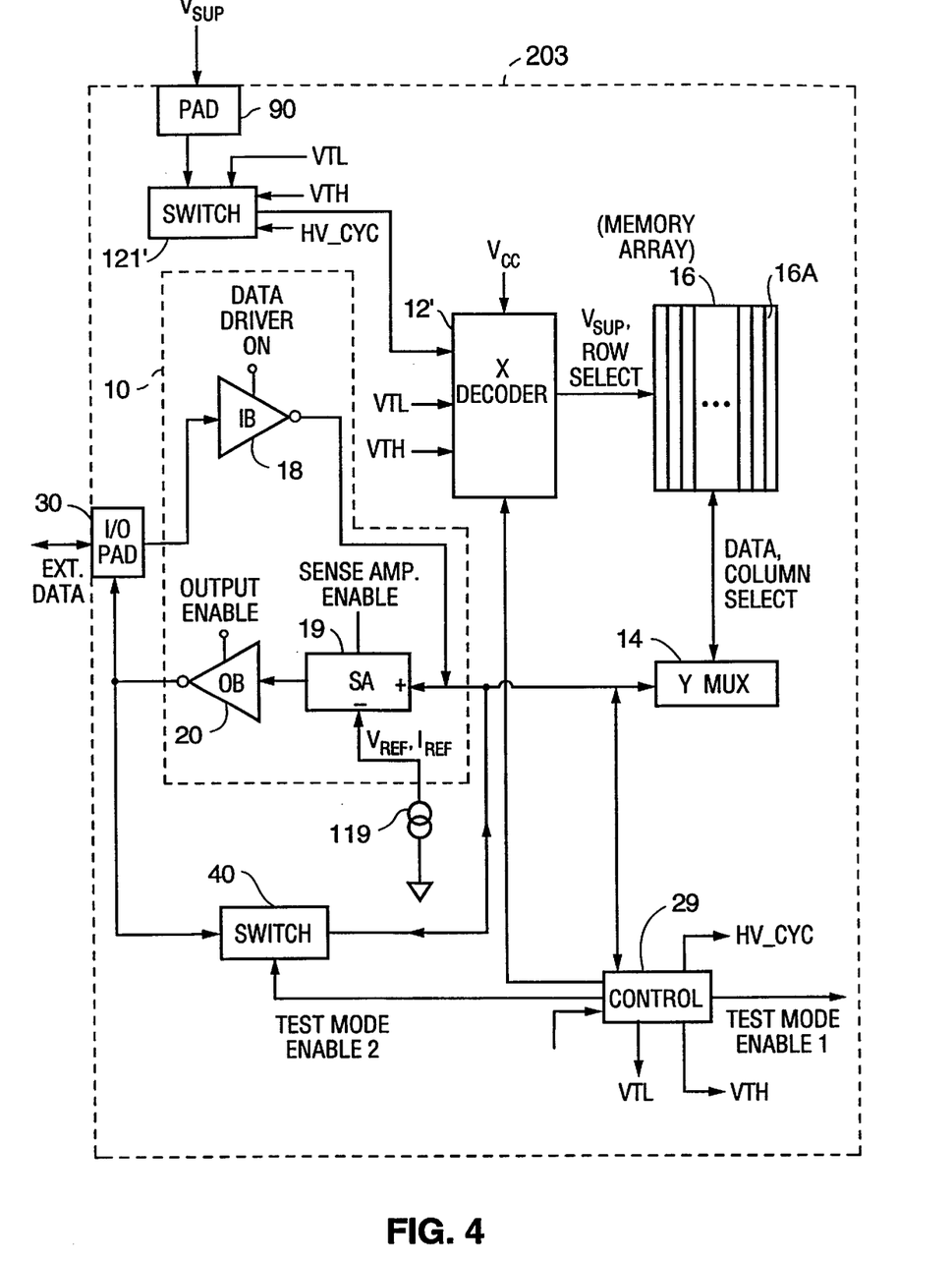
FIG. 4 is a block diagram of a nonvolatile memory integrated circuit, including circuitry for implementing a true $V_{th}$ measurement test mode.

FIG. 4 is a block diagram of a memory chip 203 (of the type disclosed in U.S. Ser. No. 08/511,614) which includes improved switch 121' of the above-mentioned type (rather than switch 121 of FIG. 1). Switch 121' is connected to pad 90 for receiving a voltage $V_{sup}$ (supplied from an external device through pad 90) and the state of switch 121' is determined by control signals "VTH," "VTL," and "HV_CYC" from control unit 29. Chip 203 also includes test mode switch 40 whose state is determined by control signal "Test Mode Enable 2" from control unit 29. Chip 203 is capable of operating in test modes in which X decoder 12' asserts the voltage $V_{sup}$ received from pad 90 to the control gates of cells of all or selected ones of the wordlines of array 16.

Chip 203 can implement a true $V_{th}$ measurement test mode in which a sequence of different voltages $V_{sup}$ is applied to all or selected ones of the wordlines of array 16 (through switch 121' and X decoder 12') and the cells connected to such wordlines are read (using sense amplifier 19 and output buffer 20) once for each applied value of $V_{sup}$. Chip 203 can also operate in other test modes in which a selected voltage $V_{sup}$ is applied (through switch 121' and X decoder 12') directly to wordlines of array 16 while another voltage is applied from an external pad (e.g., I/O pad 30) directly to the drain of one or more selected cells of array 16, in order to evaluate the voltage-current characteristics of those cells.

Test mode switch 40 of chip 203 can be identical to test mode switch M1 of FIG. 1, but is preferably implemented as one of the preferred test mode switches described (with reference to FIGS. 4 and 5) in U.S. patent application Ser. No. 08/508,848, entitled "Memory Circuit with Switch for Selectively Connecting an Input/Output Pad Directly to a Nonvolatile Memory Cell," filed Jul. 28, 1995, now U.S. Pat. No. 5,594,694 (assigned to the assignee of the present application).

Generation of the control signals needed for entry into each of the test modes of chip 203 is preferably accomplished in the manner described in the U.S. patent application Ser. No. 08/508,924, entitled "Memory System Having Internal State Monitoring Circuit," filed Jul. 28, 1995, now U.S. Pat. No. 5,619,461 and in U.S. patent application Ser. No. 08/386,704 entitled "Apparatus for Entering and Executing Test Mode Operations for Memory," filed Feb. 10, 1995, now U.S. Pat. No. 5,526,364. Control unit 29 of chip 203 can include circuitry for generating the control signals needed for entry into each test mode (in response to signals received at external pads of the chip), and circuitry for generating the control signals needed for controlling operation of the chip during execution of some test mode operations and for controlling operation of the chip in the normal operating mode.

With reference to FIG. 4, sense amplifier 19 is a differential amplifier. Circuit 14 couples the noninverting input of sense amplifier 19 to a selected column of array 16. Current source 119 holds the inverting input of sense amplifier 19 at reference voltage $V_{REF}$ and causes current $I_{REF}$ to flow to ground from the inverting input of sense amplifier 19.

Still with reference to FIG. 4, when memory chip 203 enters certain ones of its test modes (including the true $V_{th}$ measurement test mode), the level of at least one of control signals "VTH" and "VTL" asserted from control unit 29 to switch 121' goes high, and the level of control signal "Test Mode Enable 2" asserted from control unit 29 to switch 40 goes low. In response to such high level of at least one of VTH and VTL, switch 121' enters a closed (conductive) state in which it asserts voltage $V_{sup}$ from pad 90 to X decoder 12'. Voltage $V_{sup}$ can have any of a broad range of selected values, including values much greater than the supply voltage $V_{cc}$ of chip 203 and values much less than supply voltage $V_{cc}$. In response to the low level of Test Mode Enable 2, switch 40 enters an "open" (non-conductive) state in which signals (indicative of data to be written to memory array 16) provided from an external device to I/O pad 30 are buffered in input buffer 18 and then asserted to memory array 16, or signals (indicative of data read from memory array 16) are asserted from memory array 16 to sense amplifier 19, and the output of sense amplifier 19 is buffered in output buffer 20 and asserted to I/O pad 30.

In other test modes of chip 203 (not including the true $V_{th}$ measurement test mode), the level of Test Mode Enable 2 is high, and switch 40 responds thereto by entering its "closed" (conductive) state in which it passes test signals indicative of test data to be written to or read from a selected cell or cells of array 16 (e.g., a current signal indicative of test data read from a selected cell). In such modes, buffers 18 and 20 are disabled and the test signals pass through switch 40 (and thus between I/O pad 30 and the selected cell or cells of array 16) without passing through buffer 10.

Figure 5:
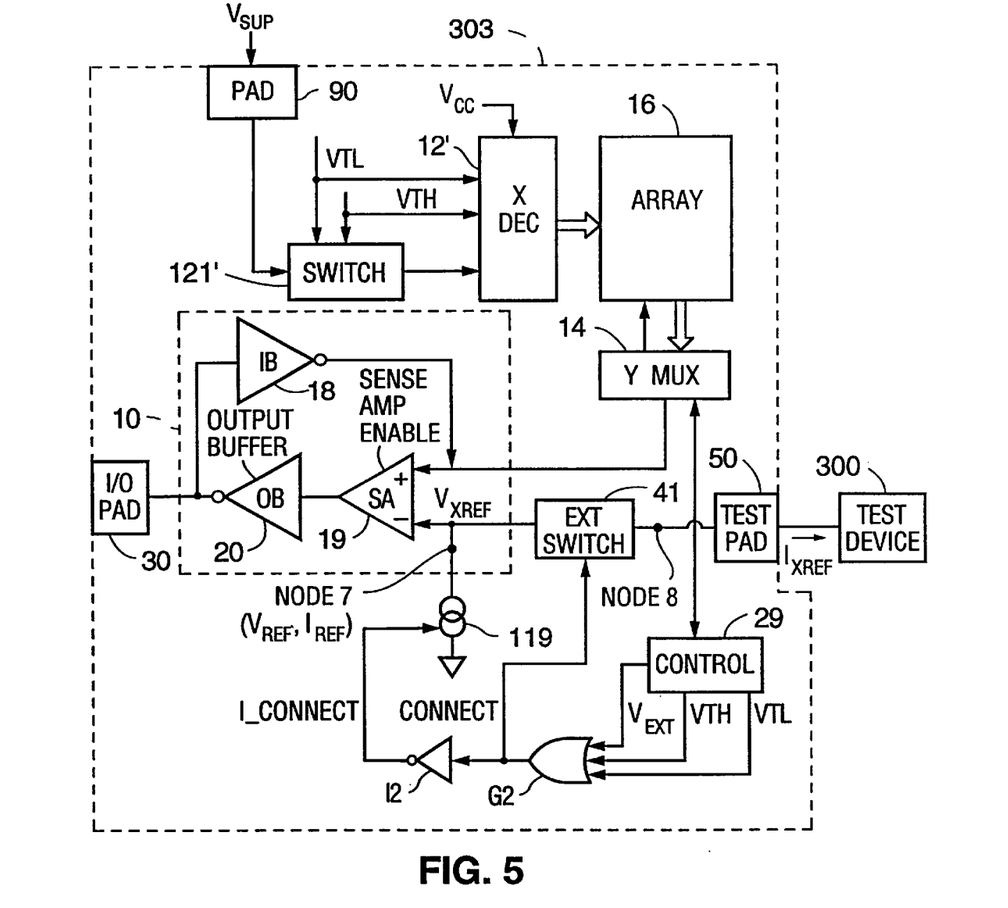
FIG. 5 is a block diagram of a preferred embodiment of the integrated nonvolatile memory circuit of the invention.

In the true $V_{th}$ measurement test mode of chip 203, control unit 29 asserts at least one of VTH and VTL with a high level to switch 121', to cause switch 121' to provide voltage $V_{sup}$ from pad 90 to X decoder 12'. As shown in FIG. 5, control unit 29 asserts control signals VTL and VTH, and also control signal HV_CYC to switch 121'. Signal VTH has a high level (a logical "1") during the true $V_{th}$ measurement test mode when $V_{sup}$ is above the supply voltage $V_{cc}$ (e.g., when $V_{cc}$ is 5 volts, and $V_{sup}$ is 12 volts), and a low level (a logical "0") during the true $V_{th}$ measurement test mode when $V_{sup}$ is below supply voltage $V_{cc}$. Also in the true $V_{th}$ measurement test mode, signal VTL has a high level when $V_{sup}$ is below the supply voltage $V_{cc}$ (e.g., when $V_{cc}$ is 5 volts, and $V_{sup}$ is 3 volts), and a low level when $V_{sup}$ is above supply voltage $V_{cc}$.

Typically, control unit 29 asserts signal VTL with a high level (and $V_{sup}$ is less than $V_{cc}$) during a process of determining threshold voltages (or threshold voltage distributions) of erased cells of array 16 in a true $V_{th}$ measurement test mode (since erased cells typically have threshold voltages substantially lower than $V_{cc}$). Typically, control unit 29 asserts signal VTH with a high level (and $V_{sup}$ is greater than $V_{cc}$) at some stages of a process of determining threshold voltages (or threshold voltage distributions) of programmed cells of array 16 in a true $V_{th}$ measurement test mode (since programmed cells typically have threshold voltages approximately equal to $V_{cc}$).

During normal operation (i.e., non-test mode operation), signal HV_CYC (which is also generated in control unit 29)

goes high when high voltage operations are required, such as to program or erase cells of the memory array. Thus, control unit 29 asserts HV_CYC with a high level to switch 121' to cause switch 121' to enter a closed state in which it provides voltage $V_{sup}$ from pad 90 to X decoder 12'.

U.S. patent application Ser. No. 08/508,923 entitled "Memory System Having Non-volatile Data Storage Structure for Memory Control Parameters and Method," filed by F. Roohparvar on Jul. 28, 1995, now U.S. Pat. No. 5,627,784, (assigned to the assignee of the present application) discloses a memory chip having circuitry for providing an internally generated adjustable reference voltage to a sense amplifier. The circuitry asserts a particular level of the reference voltage (one of a discrete set of possible reference voltages) in response to stored control bits read from non-volatile data storage units. The stored control bits can be programmed and reprogrammed at any time after fabrication of the chip in response to programming signals received at the chip from an external processor.

However, two limitations of the sense amplifier reference voltage selection circuitry of U.S. patent application Ser. No. 08/508,923 (U.S. Pat. No. 5,627,784) are: only a discrete set (rather than a continuous range) of reference voltages are available for the sense amplifier during a test mode, and the set of available reference voltages for the sense amplifier may be insufficiently broad to determine the characteristics of all the cells (with all combinations of voltages applied to the control gate and source of each cell) during a test mode.

The latter limitation can exist due to the small geometries that are typical in state of the art memory arrays, which causes the so-called "leaky column" problem often to be inherent in newly manufactured arrays, which in turn causes some cells to fail to turn off even if their control gate voltages are turned off (grounded). The "leaky column" problem causes an increased current on the column (the bitline) of each cell which fails to turn off when its control gate voltage is turned off. For example, when a programming operation has been performed to program one cell in a column and a selected voltage (e.g., 3 volts) is then applied to the cell's control gate (the selected voltage being above the threshold voltage of a typical erased cell and thus adequate to turn on a typical erased cell, but below the threshold voltage of a typical programmed cell and thus inadequate to turn on a typical programmed cell) and the other cells in the column are deselected, the current in the column may be higher than expected (due to unexpectedly high leakage). Thus: the programmed cell may incorrectly be interpreted as being in an erased state (during normal, non-test-mode operation); and it may not be possible fully to characterize the programmed cell (in a test mode in which the wordline voltage of the cell is swept or otherwise varied) unless a broad range of sense amplifier reference voltages (including reference voltages in a range lower and/or higher than typically employed to read and verify cells in normal, non-test-mode operation) are applied to the reference input terminal of the sense amplifier. The latter is true since the sense amplifier's output will change state only when the voltage at one input terminal (typically a noninverting input terminal) of the sense amplifier falls below (or rises above) the reference voltage at the sense amplifier's reference input terminal (typically an inverting input terminal). The internal reference voltage generation circuitry of the chip may be incapable of providing sufficiently high or low sense amplifier reference voltages (and corresponding sense amplifier reference currents) to characterize the cell, or the internal reference voltage generation circuitry of the chip may be incapable of providing a continuous range of sufficiently low (or high) sense amplifier reference voltages, where a continuous range of reference voltages rather than a set of discrete values thereof is needed to characterize the cell accurately.

The present invention enables implementation of test modes (including true $V_{th}$ measurement test modes) in which any of a broad range of sense amplifier reference voltages is applied directly from an external device to a reference input terminal of a sense amplifier of a memory chip, without the need for sense amplifier reference voltage selection circuitry (such as that disclosed in U.S. patent application Ser. No. 08/508,923) in the chip for implementing the test modes. The invention also enables implementation of test modes (including true $V_{th}$ measurement test modes) in which any of-a continuous range of sense amplifier reference voltages is applied directly from an external device to a reference input terminal of a sense amplifier of a memory chip, rather than one of a set of discrete values of sense amplifier reference voltages as provided by the sense amplifier reference voltage selection circuitry of U.S. Ser. No. 08/508,923.

SUMMARY OF THE INVENTION

The inventive integrated memory circuit (chip) has a memory cell array and one or more sense amplifiers for reading cells of the array. In preferred embodiments, the cells are flash memory cells. The chip is operable in at least one test mode as well as in a normal operating mode. In the normal operating mode, circuitry internal to the chip provides a reference current to (or sinks a reference current from) each sense amplifier. In a test mode, any of a range (preferably, a broad and continuous range) of external sense amplifier reference currents flows (through an external pad) between each sense amplifier and a device external to the chip.

In preferred embodiments, the memory chip includes a switch having a closed state (in which the switch allows an external reference current to flow between the external pad and an input terminal of at least one sense amplifier), and an open state (in which the switch disconnects the external pad from each sense amplifier). When the switch is in the closed state (and connects the external pad to a sense amplifier input terminal), an external device connected to the external pad can sink a desired level of current from the sense amplifier input terminal. Preferably, the switch is tolerant of a wide range of voltages on the external pad, in the following sense: after assertion of a control signal to the switch causing it to enter the open state, the switch will remain open (despite variation of the voltage on the external pad) until assertion of another control signal to the switch causing it to close.

External test equipment can operate with the inventive chip to test memory cells of the chip by controlling application of voltages to each cell (allowing cell current to flow through each cell) while the chip reads each cell (using the internal read circuitry used in the chip's normal operating mode, including at least one sense amplifier) with sense amplifier reference current flowing between an external pad of the chip and a reference input terminal of the sense amplifier. In reading each cell during the test mode, the sense amplifier operates just as it would in the normal operating mode (except that a different reference current typically flows from the sense amplifier's reference input terminal in the test mode than in the normal operating mode). By conducting tests of the array in this manner in accordance with the invention, data can be sensed from each cell (in the test mode) with all the timing constraints that are usually placed on a read of the cell in the normal operating mode.

Another aspect of the invention is a class of true threshold voltage ($V_{th}$) measurement test modes in which an external voltage (or sequence of external voltages) is applied to an external pad, a voltage $V_{XRef}$ determined by the external voltage (or sequence of voltages $V_{XRef}$ determined by the sequence of external voltages) is applied to the reference input terminal of a sense amplifier, a second external voltage (or sequence of second external voltages) is applied to another external pad, and a test voltage at least substantially equal to the second external voltage (or sequence of test voltages at least substantially equal to the sequence of second external voltages) is applied directly to one or more selected wordlines of the array. In each such true $V_{th}$ measurement test mode, circuitry embodying the invention disables the chip's internal sense amplifier reference current source (or disconnects said current source from the sense amplifier's reference input terminal).

In another test mode in accordance with the invention (a column current read test mode), all wordlines of a memory cell array are disabled, and a read cycle is performed to measure all the columns sequentially (while reference current flows, through an external pad, between external test equipment and each sense amplifier used for performing the read cycle). The sense amplifier output indicates whether one or more of the columns has leaky cells. The external test equipment can adjust the level of the reference current and thus easily and quickly identify those columns which can be repaired using redundancy.

DETAILED DESCRIPTION OF THE PREFERRED EMBODIMENTS

Preferred embodiments of the invention will be described with reference to FIGS. 5 and 6. One such embodiment is memory chip 303 shown in FIG. 5 which includes a preferred embodiment of the inventive test mode circuitry and is operable either in a normal operating mode or in a test mode (preferably, a test mode embodying the inventive method). Memory chip 303 of FIG. 5 can be identical to that chip 203 of FIG. 4, except that chip 303 also includes external I/O pad 50, switch 41, gate G2, and inverter I2 connected as shown in FIG. 5. The description of some components of FIG. 5 (identically numbered in FIGS. 4 and 5) which have been described above with reference to FIG. 4, will not be repeated below. Elements 41, G2, I2, and 119 of chip 303 are sometimes referred to herein as "mode dependent" circuitry, since in a first state (in a test mode of the chip) this circuitry provides reference current flow (and reference voltage) at sense amplifier 19's reference input terminal, and in a second state (in the chip's normal operating mode) provides a different reference current flow (and reference voltage) at sense amplifier 19's reference input terminal.

In FIG. 5, sense amplifier 19 is a differential amplifier whose noninverting input is coupled by circuit 14 to a selected column of array 16 (as in FIG. 4). I/O pad 50 is denoted as a "test pad" in FIG. 5 since in test modes of chip 303, external test device 300 can be coupled through pad 50 and switch 41 to sense amplifier 19. Otherwise (in a normal operating mode of chip 303), switch 41 decouples pad 50 from sense amplifier 19 (in a manner to be explained in more detail below), and current source 119 holds the inverting input of sense amplifier 19 at reference voltage $V_{Ref}$ and causes reference current $I_{REF}$ to flow to ground from the inverting input (reference input terminal) of sense amplifier 19.

When desired (e.g., during a read operation in the normal operating mode, and during the inventive test modes of operation), sense amplifier 19 is enabled by asserting thereto (from control unit 29) control signal SENSE AMPLIFIER ENABLE having an appropriate value. Another value of control signal SENSE AMPLIFIER ENABLE disables sense amplifier 19.

The state of switch 41 is determined by control signals "VTH," "VTL," and "$V_{Ext}$" asserted by control unit 29 to the inputs of OR gate G2. Of these, control signals VTH and VTL are identical to (and have the same function as) the identically labeled signals described above with reference to FIG. 4. At any appropriate time (during either normal operation or test mode operation of chip 303), control unit 29 asserts control signal $V_{Ext}$ with a high level to indicate that an external sense amplifier reference voltage is required. In response to a high level of signal Vat, the signal CONNECT (asserted at the output of OR gate G2) goes high.

Signal CONNECT asserted at the output of OR gate G2 has a low level only when all of VTL, VTH, and $V_{Ext}$ are low. When any of VTL, VTH, and $V_{Ext}$ are high, signal CONNECT is high. As will be described below with reference to FIG. 6, signal CONNECT is received at the input of inverter 42 of the preferred implementation of switch 41 shown in FIG. 6.

Figure 6:
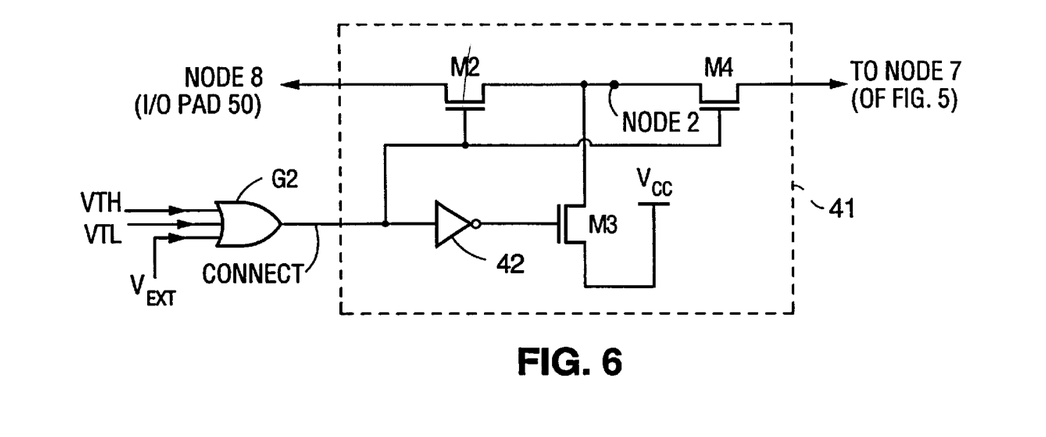
FIG. 6 is a schematic diagram of a preferred implementation of switch 41 of FIG. 5.

A preferred design for switch 41 is shown in FIG. 6. A switch having this design is disclosed in referenced U.S. Ser. No. 08/508,848, but the switch described therein is used in a different context (not for providing a voltage from an external pad of a memory chip to a sense amplifier of the chip for use as a reference voltage of the sense amplifier). In the FIG. 6 embodiment, switch 41 includes a set of series-connected pass transistors (NMOS transistors M2 and M4) and a isolation voltage switch comprising inverter 42 and NMOS transistor M3. The input of inverter 42 receives control signal CONNECT from gate G2, and the gate of NMOS transistor M3 receives the output of inverter 42 (the inverse of CONNECT). The drain of M3 is connected to supply voltage $V_{cc}$ and the source of M3 is connected to Node 2 of FIG. 6.

NMOS transistors M2 and M4 are both connected as pass transistors, with the gate of each receiving control signal CONNECT. The source and drain terminals of each of M2 and M4 will be referred to collectively as "channel" terminals. One channel terminal of M2 is connected to one channel terminal of M4 (at Node 2), the other channel terminal of M2 is connected to Node 8 (I/O pad 50 of FIG. 5), and the other channel terminal of M4 is connected to Node 7 of FIG. 5 (the reference input terminal of sense amplifier 19).

In response to a high value of signal CONNECT, the FIG. 6 embodiment of switch 41 is in a "closed" (conductive) state in which it connects an I/O pad of chip 303 (e.g., pad 50 at Node 8) to Node 7 (the reference input terminal of sense amplifier 19). In response to a low value of signal CONNECT, switch 41 is in an "open" (non-conductive) state in which it isolates the I/O pad from direct connection with Node 7, even under the condition that a transistor of switch 41 (e.g., NMOS transistor M2) undesirably becomes conductive (for example due to low voltage on I/O pad SO, inductive coupling, or the like).

When control signal CONNECT is high, pass transistors M2 and M4 connect Node 8 (I/O pad 50) with Node 7 (the reference input terminal of sense amplifier 19). When signal CONNECT is low, no current flows through the pass transistors between Node 7 and pad 50, since the isolation voltage switch holds a channel terminal of at least one of the pass transistors at a fixed supply voltage, thereby preventing at least one of the pass transistors from undesirably switching on.

Test mode switch 41 operates as follows in response to control signal CONNECT:

when CONNECT is high, M2 and M4 are "on" and M3 is "off." Thus, switch 41 is in a "closed" (conductive) state in which M2 and M4 function as pass transistors which pass current between Node 7 and Node 8; and when CONNECT is low, M2 and M4 are "off" and M3 is "on." Thus, switch 41 is in an "open" (non-conductive) state in which Node 7 is decoupled from Node 8. Typically, the "low" value of CONNECT is ground potential.

When chip 303 of FIG. 5 executes a read operation during its normal operating mode with CONNECT at a "low" level (so that M3 is "on" and M2 and M4 are "off"), if the voltage on I/O pad 50 falls sufficiently low (e.g., to −1 volt, where both M2 and M4 have a threshold voltage $V_{th}$ approximately equal to 0.5 volt), M2 will tend to turn "on." However, Node 2 (of FIG. 6) is held at $V_{cc}-V_T$ through transistor M3 (where $V_T$ is the threshold voltage of M3). Thus, if pad 50 is brought down externally to a low voltage (e.g., −1 volt), M3 will try to pull pad 50 up to level at which M2 turns off (e.g., −0.5 volt in this example) and pad 50 will try to pull down Node 2 to −1 volt. The actual voltage level of Node 2 will be somewhere between ($V_{cc}-V_T$) and −1 volt, at a specific value determined by the relative current driving strengths of M2 and M3. If M3's current driving capability is larger than M2's, then Node 2 will desirably end up closer to ($V_{cc}-V_T$) than to −1 volt. By selecting M2 to have a current driving capability that is larger than that of M3's, Node 2 will undesirably end up closer to −1 volt than to ($V_{cc}-V_T$). As explained in referenced U.S. application Ser. No. 08/508, 848, although it is conceivable that sizes for M2 and M3 could be chosen which would cause switch 41 to operate with low efficiency, it would be necessary to skew the sizes of M2 and M3 radically to design a specific implementation of switch 41 that would not function properly.

With a properly functioning implementation of switch 41, when CONNECT is low, even if M2 turns on, it would not be able to pull Node 2 down sufficiently to turn M4 on. Thus, Node 7 will remain undisturbed by a voltage at Node 8 (pad 50) which causes M2 to turn on.

With reference again to FIG. 5, inverter I2 outputs signal ICONNECT in response to signal CONNECT, and the level of ICONNECT is the logical inverse of that of signal CONNECT. Thus, when CONNECT is high (causing switch 41 to enter a closed state in which it connects pad 50 with amplifier 19), ICONNECT is low (disabling current source 119). When ICONNECT is high, current source 119 is enabled, and thus current source 119 holds Node 7 of FIG. 5 (the inverting input of sense amplifier 19) at reference voltage $V_{REF}$ and causes reference current $I_{REF}$ to flow to ground from the inverting input of sense amplifier 19, and CONNECT is low (causing switch 41 to enter a state in which it disconnects pad 50 from amplifier 19).

As described above, the current at the noninverting input of sense amplifier 19 (coupled by circuit 14 to a selected column of array 16) can be indicative of the state of selected cell (and in particular, can be indicative of the cell's threshold voltage, $V_{th}$. In a normal "read" operation in the normal operating mode of chip 303 (with CONNECT low), reference voltage $V_{REF}$ at the inverting input of sense amplifier 19 is typically indicative of a cell having a threshold voltage of 4 volts, and the measured threshold voltage $V_{th}$ is typically 3 volts or 5.5 volts (depending on whether the cell stores a "1" or a "0" bit). During a "read" operation which is part of a program verification operation (in the normal operating mode of chip 303), the reference voltage $V_{REF}$ is typically indicative of a cell having a threshold voltage of 5.5 volts. Similarly, during a "read" operation which is part of a verification operation (following an erase cycle) in the normal operating mode of chip 303, the reference voltage $V_{REF}$ is typically indicative of a cell having a threshold voltage of 3 volts.

Chip 303 of FIG. 5 can operate in test modes (determined by a high value of control signal VTL, VTH, or $V_{Ext}$) in which switch 41 is closed (switch 41 is in a "closed state") and thus external test device 300 is coupled through pad 50 and switch 41 to the inverting input of sense amplifier 19. In such test modes, device 300 holds pad 50 at external voltage $V_{XRref}$ (the inverting input of sense amplifier 19 is at a voltage substantially equal to external voltage $V_{XRef}$) and device 300 sinks current $I_{XRef}$ from the inverting input of sense amplifier 19 (through pad 50). Preferably, switch 41 is tolerant of a wide range of voltages on pad 50, in the following sense: after assertion of a low level of control signal CONNECT to switch 41 causing it to enter the open state, switch 41 will remain open (despite variation of the voltage on pad 50) until assertion of a high value of signal CONNECT to switch 41 causing it to close. As explained above, the FIG. 6 embodiment of switch 41 is tolerant of a wide range of voltages on pad 50 in this sense, but we contemplate that alternative embodiments of switch 41 will also be tolerant in this sense.

In each test mode in which switch 41 is closed, at least one sense amplifier of chip 303 (e.g., sense amplifier 19) operates to read a sequence of cells (or a sequence of columns of deselected cells) of array 16, an output buffer (e.g., output buffer 20) of chip 303 buffers the output signal of the sense amplifier, and the output of the output buffer is asserted to an I/O pad (e.g., pad 30 of FIG. 5) other than pad 50, so that an external device (such as test device 300) can receive and process the output of the output buffer. During each such test mode (and also during the normal operating mode of chip 303), control unit 29 asserts control signals causing the appropriate components of chip 303 (including circuit 12' and switch 121') to apply appropriate voltages to the control gate, source, and drain of each memory cell to be read, and control unit 29 also asserts control signals causing the appropriate components of chip 303 (e.g., circuit 14) to connect a non-reference input terminal of each sense amplifier to a selected column of array 16. Thus, in the test modes, selected cells (or entire columns of cells) of chip 303 are read using the same circuitry of chip 303 that would be used to execute a read operation in the chip's normal operating mode.

When reading cells in many of the test modes, a test voltage (preferably substantially equal to a specially selected external voltage $V_{sup}$) is applied from switch 121' through circuit 12' to the control gates of selected ones of the rows of cells of array 16, and external device 300 sinks reference current $I_{XRef}$ (through pad 50) from the reference input terminal of each sense amplifier used to read the cells, where reference current Ixef has a specially selected value (or sequence of values) for implementing one or more desired tests of the cells' characteristics. In contrast, in a read operation in the normal operating mode of chip 303, a fixed internal supply voltage (e.g., $V_{cc}$=5 volts) is applied to the control gates of the cells to be read and an internal reference voltage (e.g., $V_{Ref}$) is applied to the reference input terminal of each sense amplifier (an internal reference current source, such as source 119, sinks internal reference $I_{Ref}$ from each reference input terminal while holding each reference input terminal at internal reference voltage $V_{Ref}$).

In variations on the FIG. 5 embodiment of the inventive memory chip, the inventive chip includes more than one sense amplifier (typically, one for each of a different subset of columns of a memory cell array) and circuitry for selectively coupling each sense amplifier to one of a subset of columns of the array. In some such alternative embodiments, the inventive chip includes circuitry for coupling a first input terminal (e.g., a noninverting input terminal) of each sense amplifier to a selected one of a different subset of the columns of the array, and a switch (which can be identical to switch 41 of FIG. 5) for coupling one but not both of a current source (e.g., source 119) and an external pad (e.g., pad 50) to a reference input terminal of each sense amplifier.

In each test mode of chip 303 (or alternative embodiments of the inventive chip) in which the test mode switch (e.g., switch 41) is closed, any of a range (preferably, a broad and continuous range) of externally-generated sense amplifier reference voltages $V_{XRef}$ is provided from pad 50 (or another external pad connected to the test mode switch) to a reference input terminal of a sense amplifier of the chip. A device external to the chip (e.g., device 300) sinks (through the test mode switch and external pad) a reference current $V_{Ref}$ corresponding to each reference voltage $V_{XRef}$.

In one class of test operations implemented by chip 303, external test device 300 tests memory cells of array 16 while selected voltages are applied to each cell being tested (so that any of a range of cell currents are caused to flow through each cell). In each such test operation, each cell under test is read using the same read circuitry of chip 303 (including sense amplifier 19) that is used in reading the cell in chip 303's normal operating mode, while device 300 sinks reference current (which flows through pad 50) from the reference input terminal of sense amplifier 19. Preferably, the output of the sense amplifier is provided to the external test device from another external pad of chip 303 (e.g., pad 30). In reading each cell during such a test operation, sense amplifier 19 operates just as it would in the normal operating mode, except that the sense amplifier typically operates with its reference input terminal at a different reference voltage during the test than in the normal operating mode. Conducting tests of cells of a memory array in this manner allows sensing of data from each cell with all the timing constraints that are usually placed on a read of the cell in the normal operating mode.

Another aspect of the invention is a class of test modes (test operations) in which device 300 applies an external voltage (or sequence of external voltages) to pad 50 (and sinks a current $I_{XRef}$, or sequence of currents $I_{Ref}$ from pad 50), a voltage $V_{XRef}$ determined by the external voltage (or sequence of voltages $V_{XRef}$ determined by the sequence of external voltages) is applied to the reference input terminal of sense amplifier 19, a second external voltage $V_{sup}$ (or sequence of second external voltages $V_{sup}$) is applied to another external pad (e.g., pad 90 of FIG. 5), and a test voltage at least substantially equal to the second external voltage (or sequence of test voltages at least substantially equal to the sequence of second external voltages) is applied directly to one or more selected wordlines of array 16. In each such test mode, signal ICONNECT asserted at the output of inverter I2 disables current source 119. Depending on the particular implementation of switch 41, when the switch is closed, voltage $V_{XRef}$ at the sense amplifier reference input terminal may be substantially equal to, or different from, the external voltage at pad 50 (in either case, voltage $V_{XRef}$ is determined by the external voltage when the switch is closed).

Another test mode (test operation) in accordance with the invention is a "column current read" test mode in which all wordlines of memory cell array 16 are disabled and a read cycle is performed to measure all the columns sequentially (preferably using a single sense amplifier such as sense amplifier 19, but alternatively using a set of substantially identical sense amplifiers whose reference input terminals are all coupled to pad 50) while external test device 300 holds pad 50 at an external voltage and sinks current $I_{XRef}$ from pad 50. A reference voltage $V_{XRef}$ determined by the external voltage is thus applied to the reference input terminal of each sense amplifier used for performing the read cycle (e.g., to the inverting input terminal of sense amplifier 19 of FIG. 5). The sense amplifier output (e.g., the output of output buffer 20 which is provided to I/O pad 30) indicates whether one or more of the columns has leaky cells. Preferably, external test device 300 receives and processes the sense amplifier output, and device 300 adjusts the level of the reference voltage and reference current IXRef (preferably in response to the sense amplifier output) so that those columns which can be repaired can be identified easily and quickly using redundancy. Preferably, the following sequence of steps is performed to execute a column current read test in accordance with the invention: the memory chip is caused to enter a test mode, the X address decoder (e.g., circuit 12') and internal sense amplifier current source (e.g., source 119) are disabled, the reference input of a sense amplifier is connected to an external pad (e.g., switch 41 of FIG. 5 is caused to enter a closed state), external reference current is sunk from the external pad while a read cycle is performed to measure one column of cells (and the resulting data output from the sense amplifier is provided to a second external pad), and the read cycle is repeated for each of the other columns of cells (to measure data from all columns of the array and provide all such data to the second external pad).

Preferred embodiments of the invention have been described with reference to FIG. 5. Although these embodiments have been described in some detail, it is contemplated that changes from these embodiments can be made without departing from the spirit and scope of the invention as defined by the appended claims.

What is claimed is:

1. An integrated memory circuit operable in a selected one of a test mode and a normal operating mode, said circuit including:
   a memory array including memory cells connected along rows and columns;
   a sense amplifier having a first input for connection to a selected one of the columns and a reference input connected to a first node;

a first external pad to which a first external voltage is applied;

mode dependent circuitry connected between the first external pad and the first node, the mode dependent circuitry having a first state connecting the first node to the first external pad and a second state disconnecting the first node from the first external pad, wherein the mode dependent circuitry includes a current source and is configured to cause an internal reference current to flow between the current source and the reference input of the sense amplifier, through the first node, when the mode dependent circuitry is in the second state;

a second external pad to which a second external voltage is applied; and a switch circuit coupled between the second external pad and the memory array, wherein the switch circuit is configured to couple the second external voltage to the memory array when the mode dependent circuitry is in the first state, and to decouple the second external voltage from the memory array when the mode dependent circuitry is in the second state.

2. The circuit of claim 1, wherein an internal supply voltage is coupled to the array instead of the second external voltage when the mode dependent circuitry is in the second state.

3. The circuit of claim 1, wherein the second external voltage is coupled to cells of the selected one of the columns when the mode dependent circuitry is in the first state.

4. The circuit of claim 1, wherein each of the cells has a control gate, and the second external voltage is coupled to the control gates of the cells in selected ones of the rows when the mode dependent circuitry is in the first state.

5. The circuit of claim 4, wherein an internal supply voltage is applied to the control gates of cells to be read when the mode dependent circuitry is in the second state.

6. The circuit of claim 1, wherein the sense amplifier has an output signal, and further comprising a third external pad for asserting an output that depends on the output signal.

7. An integrated memory circuit operable in a selected one of a test mode and a normal operating mode, the circuit comprising:

a memory array including rows and columns of memory cells;

a sense amplifier having a first input for connection to a selected one of the columns and a reference input connected to a first node;

a first external pad to which a first external voltage is applied;

a first test mode circuit, coupled to the sense amplifier and to the first external pad, and configured during the test mode to apply a test voltage that depends on the first external voltage to the reference input of the sense amplifier and to connect the first input of the sense amplifier to the selected one of the columns;

a second external pad to which a second external voltage is applied; and a second test mode circuit, coupled to the second external pad and to the memory array, and configured during the test mode to apply the second external voltage to the memory array.

8. The circuit of claim 7, wherein an internal supply voltage is applied to the memory array instead of the second external voltage during the normal operating mode.

9. The circuit of claim 7, wherein the second external voltage is applied to cells of the selected one of the columns during the test mode.

10. The circuit of claim 7, wherein each of the cells has a control gate, and the second external voltage is applied to the control gates of the cells in selected ones of the rows during the test mode.

11. The circuit of claim 10, wherein an internal supply voltage is applied to the control gates of cells to be read during the normal operating mode.

12. The circuit of claim 7, wherein the sense amplifier has an output signal, and further comprising a third external pad for asserting an output that depends on the output signal.

13. An integrated memory circuit, comprising:

an array of memory cells;

a sense amplifier having a reference input, wherein the sense amplifier is coupled to the array for sensing and amplifying data stored by the memory cells;

a first external pad to which a first external voltage is applied;

a first switch circuit for selectively coupling the first external voltage to the reference input of the sense amplifier during a test mode of operation;

a second external pad to which a second external voltage is applied; and a second switch circuit for selectively coupling the second external voltage to the array of memory cells during the test mode of operation.

14. The circuit of claim 13, wherein the first switch circuit decouples the first external voltage from the reference input of the sense amplifier during a normal mode of operation.

15. The circuit of claim 14, further comprising a current source that applies an internal reference current to the reference input of the sense amplifier during the normal operation mode.

16. The circuit of claim 13, wherein the second switch circuit decouples the second external voltage from the array of memory cells during a normal mode of operation.

17. The circuit of claim 16, wherein an internal supply voltage is applied to the array of memory cells instead of the second external voltage during the normal mode of operation.

18. The circuit of claim 13, wherein the sense amplifier has an output signal, and further comprising a third external pad for asserting an output that depends on the output signal.

19. An integrated memory circuit, comprising:

an array of memory cells;

a sense amplifier having a reference input, and a sensing input coupled to the array;

a first external input/output connection, selectively coupled to the reference input, for receiving an externally-provided reference signal, the sense amplifier using the externally-provided reference signal in lieu of an internal reference signal during a test operation; and a second external input/output connection, selectively coupled to the array, for receiving an externally-provided supply voltage, the array using the externally-provided supply voltage in lieu of an internal supply voltage during the test operation.

20. The circuit of claim 19, wherein the sense amplifier has an output signal, and further comprising a third external input/output connection coupled to the sense amplifier for asserting an output that depends on the output signal of the sense amplifier.

21. A method of operating an integrated memory circuit, the circuit including a memory array including rows and columns of memory cells, a sense amplifier having a sensing input coupled to the array and a reference input, and first and second external pads, comprising:

initiating a testing mode of operation;

during the testing mode, applying a test signal to the reference input of the sense amplifier, the test signal depending on an external test signal received from the first external pad;

during the testing mode, connecting the sensing input of the sense amplifier to the array; and during the testing mode, applying an external supply voltage to the memory array, the external supply voltage received from the second external pad.

22. The method of claim 21, further comprising applying an internal reference signal to the reference input of the sense amplifier during a normal mode of operation.

23. The method of claim 21, further comprising applying an internal supply voltage to the memory array during a normal mode of operation.

24. The method of claim 21, further comprising, during the testing mode, reading cells from the memory array using the sense amplifier, and asserting outputs on a third external pad that depend on output signals from the sense amplifier during the reads.

25. A method of operating an integrated memory circuit, comprising:

initiating a testing mode of operation;

receiving a first external voltage from a first external pad;

coupling the first external voltage to a reference input of a sense amplifier during the testing mode;

receiving a second external voltage from a second external pad; and coupling the second external voltage to an array of memory cells during the testing mode.

26. The method of claim 25, further comprising decoupling the first external voltage from the reference input of the sense amplifier during a normal mode of operation.

27. The method of claim 26, further comprising applying an internal reference current to the reference input of the sense amplifier during the normal mode of operation.

28. The method of claim 25, further comprising decoupling the second external voltage from the array of memory cells during a normal mode of operation.

29. The method of claim 28, further comprising applying an internal supply voltage to the memory cell array instead of the second external voltage during the normal operation mode.

30. The method of claim 25, further comprising, during the testing mode, reading memory cells from the array using the sense amplifier, and asserting outputs on a third external pad that depend on output signals from the sense amplifier during the reads.

31. A method of testing an integrated memory circuit, comprising:

initiating a testing mode;

during the testing mode, decoupling an internal reference signal from a reference input of a sense amplifier, and coupling an external reference signal to the reference input of the sense amplifier, the external reference signal received from a first external input/output connection; and during the testing mode, decoupling an internal supply voltage from an array of memory cells, and coupling an external supply voltage to the array of memory cells, the external supply voltage received from a second external input/output connection.

32. The method of claim 31, further comprising, during the testing mode, reading memory cells from the array using the sense amplifier, and asserting outputs on a third external input/output connection that depend on output signals from the sense amplifier during the reads.

* * * * *

UNITED STATES PATENT AND TRADEMARK OFFICE
CERTIFICATE OF CORRECTION

PATENT NO. : 6,275,961 B1  
DATED : August 14, 2001  
INVENTOR(S) : Frankie Fariborz Roohparvar Page 1 of 1

It is certified that error appears in the above-identified patent and that said Letters Patent is hereby corrected as shown below:

Column 12,
Line 15, delete "of-a" and insert -- of a --, therefor.

Column 14,
Line 34, delete "Vat" and insert -- $V_{Ext}$ --, therefor.

Column 16,
Line 12, insert -- ) -- after "$V_{th}$".

Column 17,
Line 8, delete "Ixef" and insert -- $I_{XRef}$ --, therefor.
Line 67, delete "$I_{Ref}$" and insert -- $I_{XRef}$ --, therefor.

Signed and Sealed this

Fifth Day of March, 2002

Attest:

JAMES E. ROGAN
*Attesting Officer*     *Director of the United States Patent and Trademark Office*